(12) United States Patent
Bang et al.

(10) Patent No.: US 10,529,786 B2
(45) Date of Patent: Jan. 7, 2020

(54) THIN-FILM TRANSISTOR AND ORGANIC LIGHT-EMITTING DISPLAY DEVICE INCLUDING THE SAME

(71) Applicant: LG Display Co., Ltd., Seoul (KR)

(72) Inventors: HyungJin Bang, Goyang-si (KR); MinHo Shin, Paju-si (KR); ByungJun Lim, Ansan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/643,206

(22) Filed: Jul. 6, 2017

(65) Prior Publication Data

US 2018/0012946 A1   Jan. 11, 2018

(30) Foreign Application Priority Data

Jul. 7, 2016   (KR) .................. 10-2016-0085956

(51) Int. Cl.
*H01L 27/32* (2006.01)
*H01L 29/786* (2006.01)
*H01L 29/66* (2006.01)
*H01L 27/12* (2006.01)

(52) U.S. Cl.
CPC ...... *H01L 27/3248* (2013.01); *H01L 27/1222* (2013.01); *H01L 29/66757* (2013.01); *H01L 29/66969* (2013.01); *H01L 29/78618* (2013.01); *H01L 29/78624* (2013.01); *H01L 29/78675* (2013.01); *H01L 27/1225* (2013.01); *H01L 27/3262* (2013.01); *H01L 29/7869* (2013.01); *H01L 2227/323* (2013.01)

(58) Field of Classification Search
CPC ......... H01L 29/78624; H01L 29/66659; H01L 29/7835; H01L 29/66757; H01L 27/3209; H01L 27/3225; H01L 27/3258; H01L 27/326; H01L 27/3262; H01L 29/78621
See application file for complete search history.

(56) References Cited

U.S. PATENT DOCUMENTS 7,041,540 B1 * 5/2006 Chang ............... H01L 29/66757
                                                                257/E21.336
2014/0145179 A1 * 5/2014 Yoon ................. H01L 29/66969
                                                                257/43

FOREIGN PATENT DOCUMENTS

JP        3321949      *  9/2002
KR   10-0466963 B1       1/2005
KR   10-1319196 B1      10/2013

* cited by examiner

Primary Examiner — Thanhha S Pham
(74) Attorney, Agent, or Firm — Polsinelli PC

(57) ABSTRACT

A thin-film transistor includes an active layer, a gate electrode, a source electrode and a drain electrode. The gate electrode overlaps the active layer. The source electrode and the drain electrode are connected to the active layer. The active layer includes a source region connected to the source electrode, a drain region connected to the drain electrode, a channel region overlapping with the gate electrode, a first resistive region between the source region and the channel region, and a second resistive region between the drain region and the channel region. The length of the first resistive region is larger than the length of the second resistive region.

24 Claims, 10 Drawing Sheets

THIN-FILM TRANSISTOR AND ORGANIC LIGHT-EMITTING DISPLAY DEVICE INCLUDING THE SAME

CROSS-REFERENCE TO RELATED APPLICATIONS

This application claims the priority of Korean Patent Application No. 10-2016-0085956 filed on Jul. 7, 2016, in the Korean Intellectual Property Office, the disclosure of which is incorporated herein by reference in its entirety.

BACKGROUND

Field of the Disclosure

The present disclosure relates to a display device, and more particularly, to a thin-film transistor and an organic light-emitting display device including the thin-film transistor. Although the present disclosure is suitable for a wide scope of applications, it is particularly suitable for precisely controlling the grayscale of the organic light-emitting display device.

Description of the Background

Flat panel display devices such as a liquid-crystal display device and an organic light-emitting display device have a thin thickness and a low power consumption, and thus are attracting attention as the next generation display device.

Among these, an organic light-emitting display device is a self-light-emitting type display device. Accordingly, the organic light-emitting display device does not require an additional light source, unlike a liquid-crystal display (LCD) device. Therefore, an organic light-emitting display device can be made lighter and thinner than an LCD device. Further, an organic light-emitting display device has advantages in that it is driven with a low voltage to consume less power, and that it has a faster response time, a wider viewing angle and a good contrast ratio (CR). For these reasons, an organic light-emitting display device is currently under development as the next generation display device.

An organic light-emitting display device includes an organic light emission element and a driving thin-film transistor electrically connected to the organic light emission element. The organic light emission element emits light of a specific wavelength based on the driving current transmitted through the driving thin-film transistor.

Since the intensity of light emitted from the organic light emission element is proportional to the amount of the driving current transmitted through the driving thin-film transistor, the brightness of the organic light emission element can be adjusted by controlling the driving current transmitted through the driving thin-film transistor.

Recently, research and development for reducing the power consumption of organic light-emitting display devices have been actively conducted. In particular, there are efforts to develop an organic light emission element that can emit light of high luminance with low driving current. However, it is difficult to control the grayscale of such organic light emission elements driven with low driving current.

Specifically, a sub-pixel including an organic light emission element can be driven with various grayscale values so that the organic light-emitting display device can reproduce vivid and colorful images. For example, a sub-pixel may be driven with 255 grayscale levels between white light and black light. Since the grayscale of a sub-pixel is realized by controlling the brightness of the organic light emission element, the grayscale of the sub-pixel can be controlled by adjusting the amount of the driving current supplied to the organic light emission element.

However, as described above, as the characteristics of organic light emission elements are improved, they can emit light of a high luminance even with a small driving current, and thus the grayscale of the organic light emission elements may change sensitively in response to a minute change in the driving current supplied through the thin-film transistor. That is, in order to express the 255 grayscale levels, the driving current supplied to an organic light emission element should be divided into 255 levels. However, since the luminance of an organic light emission element driven with a small driving current sensitively changes in response to even a small change in the driving current, the gaps between the levels of the driving current also become smaller.

Meanwhile, in an active matrix organic light emitting display (AMOLED), a driving thin-film transistor for driving an organic light emission element is formed separately for each sub-pixel, and each driving thin-film transistor is individually controlled to determine the grayscale of each sub-pixel. In particular, a high-resolution organic light-emitting display device includes a plurality of driving thin-film transistors densely arranged in a small area. However, due to processing errors or particular characteristics during the processes of forming the driving thin-film transistors, the device characteristics of the driving thin-film transistors may slightly differ from one another. If driving thin-film transistors have different device characteristics, the amounts of the driving currents transmitted through the driving thin-film transistors may change slightly. When this happens, the luminance of the organic light emission element may be sensitive to a change in the driving current, and the grayscale of some sub-pixels may deviate. As a result, mura (i.e. irregularities such as stains or spots) can be seen in images displayed on the organic light-emitting display device.

SUMMARY

The inventors of the application have recognized that there is a limit in expression various grayscale levels in an organic light-emitting display device because the luminance of the organic light emission element is sensitive to a very small or minute change in driving current. Further, the inventors of the application have recognized that the driving current output through a thin-film transistor is sensitive to a minute change in the potential difference between the gate electrode and the source electrode of the thin film transistor. In view of the above, the inventors of the application have devised a thin-film transistor whose driving current does not sensitively change in response to a minute change in the potential difference between the gate electrode and the source electrode of the thin-film transistor, by way of forming a first resistive region between the channel region and the source region of the thin-film transistor.

Accordingly, a characteristic of the present disclosure is to provide a thin-film transistor in which a length of a first resistive region disposed between a channel region and a source region of an active layer of the thin-film transistor is larger than a length of a second resistive region disposed between the channel region and a drain region, such that the driving current is not sensitively changed in response to a minute change in the potential difference between the gate electrode and the source electrode of the thin film transistor, and an organic light-emitting display device including the thin-film transistor.

It should be noted that the characteristics of the present disclosure are not limited to the above-described, and other characteristics of the present disclosure will be apparent to those skilled in the art from the following descriptions.

According to an aspect of the present disclosure, there is provided a thin-film transistor including an active layer, a gate electrode, a source electrode and a drain electrode. The gate electrode overlaps with the active layer. The source electrode and the drain electrode are connected to the active layer. The active layer includes a source region connected to the source electrode, a drain region connected to the drain electrode, a channel region overlapping with the gate electrode, a first resistive region between the source region and the channel region, and a second resistive region between the drain region and the channel region. The length of the first resistive region is larger than the length of the second resistive region on the plane. A thin film transistor according to an exemplary aspect of the present disclosure intentionally increases the resistance between the source region and the channel region using the first resistive region of the active layer. Accordingly, the potential difference between the gate electrode and the source electrode necessary for moving the charges from the source region to the drain region when the thin film transistor is turned on may be increased. As a result, the change in the driving current in response to the change in the potential difference between the gate electrode and the source electrode is reduced, such that the gap between the levels of the potential difference between the gate electrode and the source electrode for changing the driving current can be widened.

According to another aspect of the present disclosure, there is provided an organic light-emitting display device including an organic light-emitting diode and a thin-film transistor. The thin-film transistor is electrically connected to the organic light-emitting diode and has an active layer, a gate electrode overlapping with the active layer, and a source electrode and a drain electrode connected to the active layer. The active layer includes a first resistive region that increases a potential difference ($V_{GS}$) between the gate electrode and the source electrode necessary for moving charges from the source electrode to the drain electrode when the thin-film transistor is turned on. The organic light-emitting display device according to an exemplary aspect of the present disclosure includes a thin-film transistor having a first resistive region. The first resistive region increases the potential difference between the gate electrode and the source electrode required for moving the charges from the source electrode to the drain electrode when the thin film transistor is turned on. Accordingly, the driving current output through the thin-film transistor may not be sensitively change despite a change in the potential difference between the gate electrode and the source electrode. Accordingly, the grayscale of the organic light-emitting diode may not be sensitive to a change in the potential difference between the gate electrode and the source electrode, such that the grayscale of the organic light-emitting diode can be controlled more easily.

According to another aspect of the present disclosure, there is provided a thin-film transistor for a display device including an active layer comprising a source region, a drain region, and a channel region, and first and second resistive regions; a gate electrode vertically overlapping the active layer; and source and drain electrodes, both connected to the active layer, wherein the first resistive region has a first length and disposed between the source region and the channel region and the second resistive region has a second length and disposed between the drain region and the channel region, and the first length is greater than the second length, and wherein the first length configured to minimize a variation in a potential difference between the gate electrode and the source electrode with respect to a variation in a driving current of the display device.

Particulars of the exemplary aspects of the present disclosure will be described in the detail description with reference to the accompanying drawings.

According to an exemplary aspect of the present disclosure, it is possible to suppress the grayscale of an organic light emission element from sensitively reacting to a minute change in the potential difference between the gate electrode and the source electrode of a driving thin film transistor.

Further, according to an exemplary aspect of the present disclosure, it is possible to easily control the grayscale of an organic light emission element by increasing the gap between levels of the data voltage for changing the grayscale of the organic emission element.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
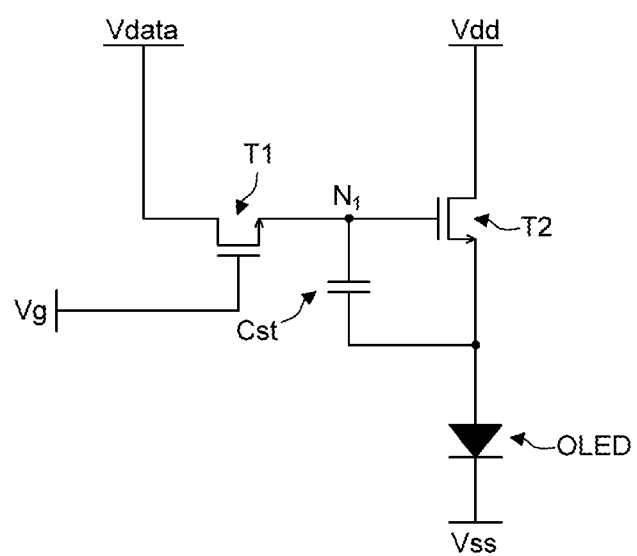
FIG. 1 is a circuit diagram of a sub-pixel of an OLED device according to an exemplary aspect of the present disclosure.

Advantages and features of the present disclosure and methods to achieve them will become apparent from the descriptions of exemplary aspects herein below with reference to the accompanying drawings. However, the present disclosure is not limited to exemplary aspects disclosed herein but may be implemented in various different ways. The exemplary aspects are provided for making the disclosure of the present disclosure thorough and for fully conveying the scope of the present disclosure to those skilled in the art. It is to be noted that the scope of the present disclosure can be defined by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationships, such as "an element A on an element B," "an element A above an element B," "an element A below an element B" and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

The terms first, second and the like in the descriptions and in the claims are used for distinguishing between similar elements and not necessarily for describing a sequential or chronological order. Theses terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various exemplary aspects of the present disclosure may be combined partially or totally. As will be clearly appreciated by those skilled in the art, technically various interactions and operations are possible. Various exemplary aspects can be practiced individually or in combination.

Hereinafter, exemplary aspects of the present disclosure will be described in detail with reference to the accompanying drawings.

FIG. 1 is a circuit diagram of a sub-pixel of an organic light-emitting display device according to an exemplary aspect of the present disclosure. The organic light-emitting display device according to the exemplary aspect includes a plurality of sub-pixels. The sub-pixels may include red, green and blue sub-pixels. A red sub-pixel, a green sub-pixel and a blue sub-pixel may operate as a single pixel. However, it is to be noted that the type of the sub-pixels is not limited thereto. For example, the organic light-emitting display device may further include a white sub-pixel in addition to red, green, and blue sub-pixels.

Referring to FIG. 1, the sub-pixel of the organic light-emitting display device includes a switching thin-film transistor T1, a driving thin-film transistor T2, a storage capacitor Cst, and an organic light-emitting diode (OLED).

Although the driving thin-film transistor T2 and the switching thin-film transistor T1 are shown as n-type thin-film transistors in FIG. 1, each of the driving thin-film transistor T2 and the switching thin-film transistor T1 may be an n-type thin-film transistor or a p-type thin-film transistor.

In addition, although the sub-pixel shown in FIG. 1 includes two thin-film transistors and one capacitor, the sub-pixel may include more than two thin-film transistors and more than one capacitor in other implementations. In the following description, it is assumed that the switching thin-film transistor T1 and the driving thin-film transistor T2 are n-type thin-film transistors, and the sub-pixel includes two thin-film transistors and one capacitor.

The switching thin-film transistor T1 is connected between a data line and a first node N1. The switching thin-film transistor T1 is turned on or off in response to a scan voltage Vg and connects the data line with the first node N1 when it is turned on. That is, the data voltage Vdata provided from the data line is supplied to the first node N1.

The driving thin-film transistor T2 is electrically connected in series with the organic light-emitting diode OLED between a first supply voltage line and a second supply voltage line, and supplies a driving current to the organic light-emitting diode OLED. The driving thin-film transistor T2 is turned on or turned off in response to the voltage at a first node N1. The driving thin-film transistor T2 applies a high-potential voltage Vdd from the first supply voltage line to the anode of the organic light-emitting diode OLED when it is turned on.

The storage capacitor Cst is connected to the first node N1 and holds the data voltage Vdata for one frame to regulate the amount of current flowing through the organic light-emitting diode OLED, thereby maintaining the grayscale level displayed by the organic light-emitting diode OLED. The storage capacitor Cst includes one electrode connected to the gate electrode of the driving thin-film transistor T2 and the other electrode connected to the source electrode of the driving thin-film transistor T2.

The organic light-emitting diode OLED includes an anode connected to the other electrode of the storage capacitor Cst and a cathode connected to the second supply voltage line. The organic light-emitting diode OLED emits light based on the driving current supplied through the driving thin-film transistor T2 when it is turned on. At this time, the high-potential voltage Vdd and the low-potential voltage Vss are applied to the two terminals of the organic light-emitting diode OLED, respectively.

Figure 2:
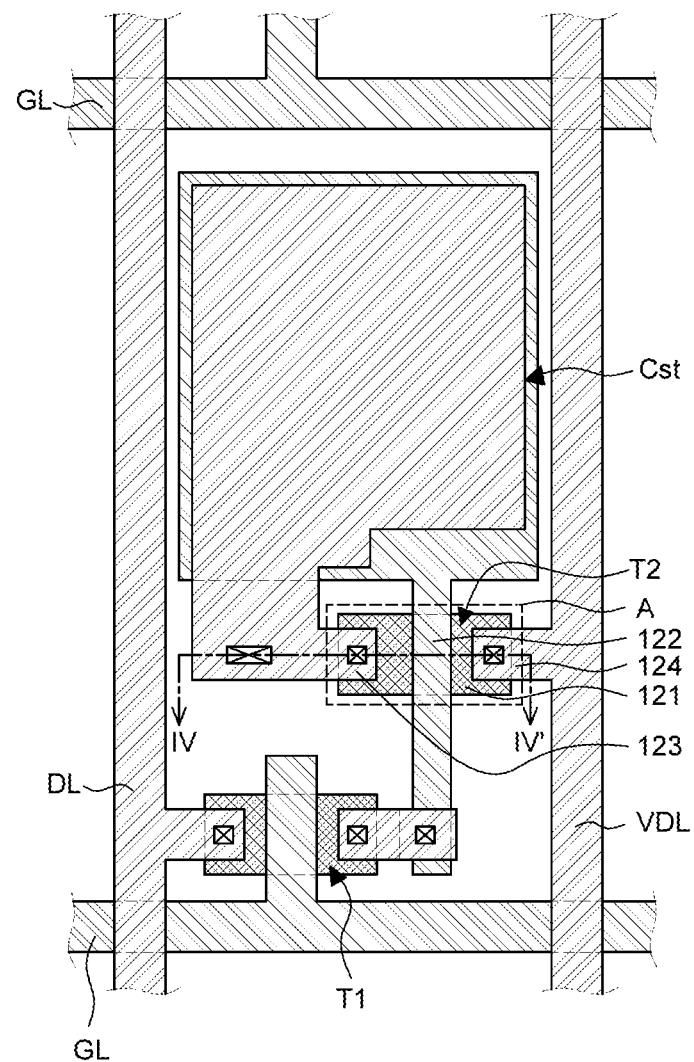
FIG. 2 is a plan view for illustrating an organic light-emitting display device according to an exemplary aspect of the present disclosure.

FIG. 2 is a plan view for illustrating an organic light-emitting display device according to an exemplary aspect of the present disclosure. Referring to FIG. 2, gate lines GL and data lines DL intersect one another to define a sub-pixel region. The driving thin-film transistor T2, the switching thin-film transistor T1, the storage capacitor Cst and the organic light-emitting diode are disposed in the sub-pixel region.

The organic light-emitting display device according to an exemplary aspect of the present disclosure may include a top-emission organic light-emitting diode or a bottom-emission organic light-emitting diode. FIG. 2 shows a sub-pixel including a top-emission organic light-emitting diode. In the example shown in FIG. 2, the light emitted from the organic light-emitting diode exits upwardly of the organic light-emitting diode, i.e., in a direction away from the plane of the paper of FIG. 2, and thus the organic light-emitting diode may be disposed above and overlap the driving thin-film transistor T2, the switching thin-film transistor T1 and the storage capacitor Cst. The organic light-emitting diode is not depicted in FIG. 2 so as to focus on the arrangement and the connective relationship of the driving thin-film transistor T2, the switching thin-film transistor T1 and the storage capacitor Cst.

On the other hand, if an organic light-emitting display device according to an exemplary aspect of the present disclosure includes a bottom-emission organic light-emitting diode, the driving thin-film transistor T2, the switching thin-film transistor T1 and the storage capacitor Cst may be disposed on one side of a sub-pixel region while the organic light-emitting diode may be disposed on the other side of the sub-pixel region so as not to overlap them.

As shown in FIG. 2, the driving thin-film transistor T2 includes: an active layer 121; a gate electrode 122 overlapping the active layer 121 and connected to one electrode of the storage capacitor Cst; a source electrode 123 connected to the other electrode of the storage capacitor Cst and connected to the active layer 121; and a drain electrode 124 connected to the first supply voltage line VDL and connected to the active layer 121. The anode of the organic light-emitting diode is electrically connected to the source electrode 123 of the driving thin-film transistor T2. However, this is merely illustrative. If the driving thin-film transistor T2 is a p-type thin-film transistor, the anode of the organic light-emitting diode is electrically connected to the drain electrode 124 of the driving thin-film transistor T2.

The shortest distance from the side line of the gate electrode 122 of the driving thin-film transistor T2 to the side line of the source electrode 123 is larger than the shortest distance from the side line of the gate electrode 122 to the side line of the drain electrode 124. In contrast, the shortest distance from the side line of the gate electrode to the side line of the source electrode is equal to the shortest distance from the side line of the gate electrode to the side line of the drain electrode. That is, the source electrode and the drain electrode of the switching thin-film transistor T1 are symmetrical with respect to the gate electrode, while the source electrode 123 and the drain electrode 124 of the driving thin-film transistor T2 are asymmetrical with respect to the gate electrode 122. The structural characteristics of the driving thin-film transistor T2 will be described in detail below with reference to FIG. 3.

Figure 3:
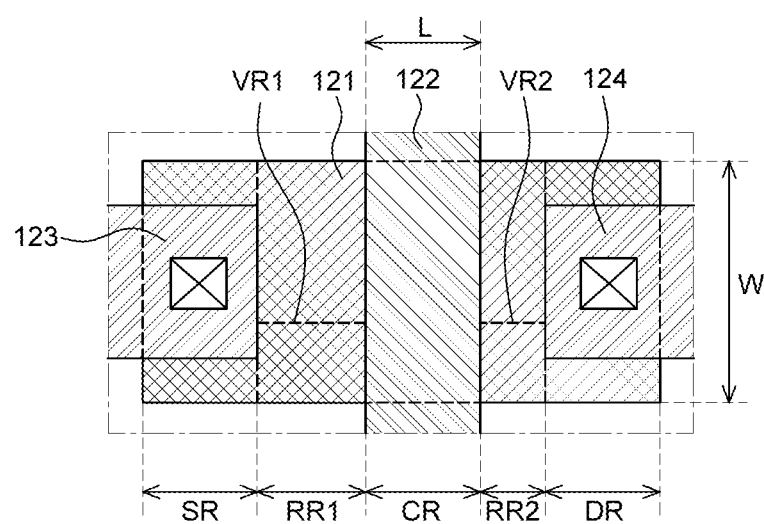
FIG. 3 is an enlarged plan view of portion A of FIG. 2 for illustrating a driving thin-film transistor of an organic light-emitting display device according to an exemplary aspect of the present disclosure.

FIG. 3 is an enlarged plan view of portion A of FIG. 2 for illustrating a driving thin-film transistor of an organic light-emitting display device according to an exemplary aspect of the present disclosure.

Referring to FIG. 3, the active layer 121 of the driving thin-film transistor T2 includes a source region SR, a first resistive region RR1, a channel region CR, a second resistive region RR2, and a drain region DR.

The source region SR of the active layer 121 is connected to the source electrode 123, and the drain region DR is connected to the drain electrode 124. The source region SR and the drain region DR refer to regions of the active layer 121 that have good conductivity. The channel region CR of the active layer 121 overlaps the gate electrode 122. When a scan voltage is applied to the gate electrode 122, charges are concentrated on the channel region CR, to form a channel. The first resistive region RR1 is formed between the channel region CR and the source region SR, and the second resistive region RR2 is formed between the channel region CR and the drain region DR. The first resistive region RR1 and the second resistive region RR2 suppress electrons from being overly accelerated from the source region SR to the drain region DR. In particular, the first resistive region RR1 reduces deviations in the driving current due to the potential difference between the gate electrode 122 and the source electrode 123 of the driving thin-film transistor T2. A detailed description thereof will be provided later.

The channel region CR is a region where the gate electrode 122 overlaps the active layer 121. The channel region CR has a width W equal to the width of the active layer 121 and a length L equal to the width of the gate electrode 122. The electrons in the source region SR pass through the channel region CR and move to the drain region DR along the horizontal direction of the active layer 121. Accordingly, the horizontal direction of the active layer 121 is defined as the length L of the channel region CR, and the vertical direction of the active layer 121 is defined as the width W of the channel region CR.

The first resistive region RR1 and the second resistive region RR2 are disposed so that they are in contact with the channel region CR. The length of the first resistive region RR1 is greater (i.e. longer) than the length of the second resistive region RR2. The length of the first resistive region RR1 is the length of the shortest line VR1 extending from the boundary between the first resistive region RR1 and the channel region CR to the boundary between the first resistive region RR1 and the source region SR. In addition, the length of the second resistive region RR2 is the length of the shortest line VR2 extending from the boundary between the second resistive region RR2 and the channel region CR to the boundary between the second resistive region RR2 and the drain region DR.

Since the length of the first resistive region RR1 is greater (i.e. longer) than the length of the second resistive region RR2, the area of the first resistive region RR1 may be greater than the area of the second resistive region RR2. However, this is merely illustrative. In other implementations, the area of the first resistive region RR1 may be equal to or less than the area of the second resistive region RR2 depending on the shape of the active layer 121 in plane.

The source region SR is in contact with the first resistive region RR1, and the boundary between the source region SR and the first resistive region RR1 corresponds to the side line of the source electrode 123. The drain region DR comes in contact with the second resistive region RR2, and the boundary between the drain region DR and the second resistive region RR2 corresponds to the side line of the drain electrode 124.

Figure 4:
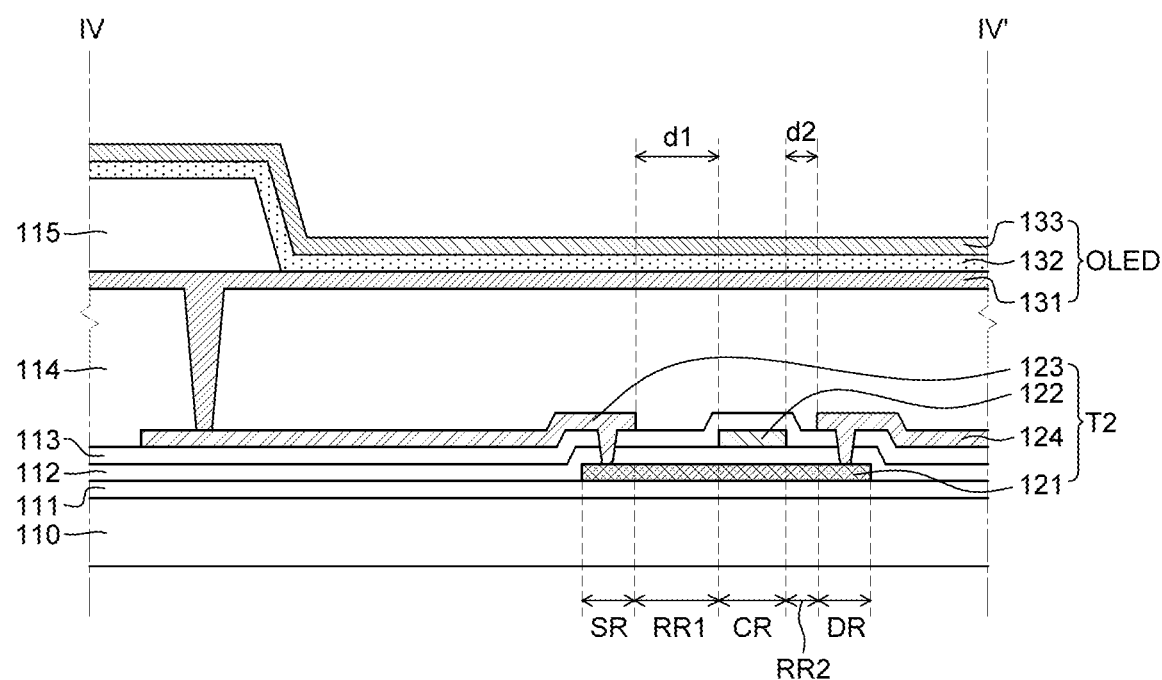
FIG. 4 is a cross-sectional view taken along line IV-IV' of FIG. 2 for illustrating a driving thin-film transistor of an organic light-emitting display device according to an exemplary aspect of the present disclosure.

FIG. 4 is a cross-sectional view taken along line IV-IV' of FIG. 2 for illustrating a driving thin-film transistor of an organic light-emitting display device according to an exemplary aspect of the present disclosure.

Referring to FIG. 4, the driving thin-film transistor T2 is disposed on a buffer layer 111 of the substrate 110. The substrate 110 supports and protects various components of the organic light-emitting display device. The substrate 110 may be made of an insulative material, for example, a glass or plastic material.

The buffer layer 111 prevents permeation of moisture or impurity through the substrate 110 and provides a flat surface over the substrate 110. It is to be noted that the buffer layer 111 may not be an essential element and the buffer layer 111 may or may not be formed based on the type of the substrate 110 or the type of the thin-film transistor disposed on the buffer layer 111.

The active layer 121 of the driving thin-film transistor T2 is formed on the buffer layer 121. The active layer 121 is made of polysilicon or metal oxide. When the active layer 121 is formed of a metal oxide, the active layer 121 may be formed of, but is not limited to, ITO (Indium Tin Oxide), IZO (Indium Zinc Oxide), IGZO (Indium Gallium Zinc Oxide), ITZO (Indium Tin Zinc Oxide), etc. Since the polysilicon or metal oxide has a higher charge mobility than that of typical silicon, the device characteristics of the driving thin-film transistor T2 can be improved when the driving thin-film transistor T2 includes the active layer 121 formed of polysilicon or metal oxide.

When the active layer 121 is made of polysilicon, the source region SR and the drain region DR of the active layer 121 are doped with impurities so that the source region SR and the drain region DR may have higher conductivities than those of the rest of the regions. For example, when the driving thin-film transistor T2 is an n-type thin-film transistor, the source region SR and the drain region DR may be doped with n-type impurities such as phosphorus (P), arsenic (As), antimony (Sb) and bismuth (Bi). When the driving thin-film transistor T2 is formed of a p-type thin-film transistor, the source region SR and the drain region DR may be doped with p-type impurities such as boron (B), aluminum (Al), indium (In) and gallium (Ga).

When the active layer 121 is made of a metal oxide, the source region SR and the drain region DR of the active layer 121 may be made conductive and have higher conductivities than those of other regions. For example, the source region SR and the drain region DR of the active layer 121 can be made conductive by being plasma-treated.

The channel region CR, the first resistive region RR1 and the second resistive region RR2 of the active layer 121 have lower conductivities, i.e., higher resistances than the source region SR and the drain region DR. For example, when the active layer 121 is made of polysilicon, the channel region CR, the first resistive region RR1 and the second resistive region RR2 may be undoped regions where no impurities are doped. In addition, when the active layer 121 is made of polysilicon, the channel region CR may be an undoped region where no impurity is doped, while the first resistive region RR1 and the second resistive region RR2 may be lightly doped drain (LDD) regions having a smaller amount of doped impurities than the source region SR and the drain region DR. On the other hand, when the active layer 121 is made of metal oxide, the channel region CR, the first resistive region RR1 and the second resistive region RR2 may be non-conductive regions that are not made conductive. In the following description, it is assumed that the active layer 121 is made of polysilicon, that the channel region CR is an undoped region, and that the first resistive region RR1 and the second resistive region RR2 are the LDD regions. However, this is merely illustrative. For example, the first resistive region RR1 and the second resistive region RR2 may be undoped regions of the active layer 121 made of polysilicon, or non-conductive region of the active layer 121 made of metal oxide.

The boundaries among the source region SR, the first resistive region RR1, the channel region CR, the second resistive region RR2 and the drain region DR can be determined based on changes in the impurity concentration in each of the regions. Specifically, the source region SR and the drain region DR are doped with n-type impurities at a concentration higher than the first resistive region RR1 and the second resistive region RR2. Therefore, the boundary between the source region SR and the first resistive region RR1 and the boundary between the drain region DR and the second resistive region RR2 may be defined as portions where the concentration of the n-type impurities abruptly changes. Since the channel region CR is a region where no n-type impurity is doped, the boundary between the channel region CR and the first resistive region RR1 and the boundary between the channel region CR and the second resistive region RR2 may be defined as the boundary between the region where the n-type impurities exist and the region where no n-type impurities exist.

The first resistive region RR1 and the second resistive region RR2 mitigate the electric field propagating from the source region SR toward the drain region DR to thereby reduce the acceleration of electrons moving from the source region SR to the drain region DR. Accordingly, it is possible to avoid degradation of the device characteristics of the driving thin-film transistor T2 caused by the accelerated electrons.

This will be described in more detail. If the size of the driving thin-film transistor T2 is very small, the length L of the channel region CR of the driving thin-film transistor T2 is reduced, and the electric field from the source region SR toward the drain region DR may be intensified. If so, electrons moving from the source region SR to the drain region DR can be accelerated by the strong electric field, such that the accelerated electrons may be introduced into the interface between the active layer 121 and the gate insulating layer 112, resulting in dielectric breakdown of the gate insulating layer 112. To avoid this, the first resistive region RR1 and the second resistive region RR2 are disposed between the source region SR and the channel region CR and between the drain region DR and the channel region CR, respectively, such that they mitigate the intensity of the electric field propagating from the source region SR toward the drain region DR. As a result, the acceleration of the electrons is reduced, and the dielectric breakdown of the gate insulating layer 112 by the accelerated electrons can be reduced.

In particular, since the length of the first resistive region RR1 is greater (i.e. longer) than the length of the second resistive region RR2, the first resistive region RR1 may also reduce change in the driving current due to change in the potential difference between the gate electrode 122 and the source electrode 123, in addition to mitigating the acceleration of the electrons A more detailed description thereof will be given later.

Since the length of the first resistive region RR1 is greater (i.e. longer) than the length of the second resistive region RR2, the resistance of the first resistive region RR1 is greater (i.e. longer) than the resistance of the second resistive region RR2. Specifically, the resistance of the first resistive region RR1 may be at least two times higher than the resistance of the second resistive region RR2.

A gate insulating layer 112 is disposed so that it covers the active layer 121. The active layer 121 is insulated from the gate electrode 122 by the gate insulating layer 112.

A gate electrode 122 is disposed on the gate insulating layer 112. The gate electrode 122 is formed in line with the channel region CR of the active layer 121. When a scan voltage is applied to the gate electrode 122, a channel is formed in the channel region CR in line with the gate electrode 122.

An inter-layer insulating layer 113 is disposed over the gate electrode 122. The interlayer insulating layer 113 insulates the gate electrode 122 from the source electrode 123 and the drain electrode 124.

A source electrode 123 and a drain electrode 124 are disposed on the interlayer insulating layer 113. The source electrode 123 and the drain electrode 124 are connected to the source region SR and the drain region DR of the active layer 121, respectively, through contact holes formed in the interlayer insulating layer 113 and the gate insulating layer 112.

As described above, the shortest distance d1 from the side line of the source electrode 123 to the side line of the gate electrode 122 is larger than the shortest distance d2 from the side line of the drain electrode 124 to the side line of the gate electrode 122. The first resistive region RR1 may be formed in line with the spacing between the source electrode 123 and the gate electrode 122, and the second resistive region RR2 may be formed in line with the spacing between the drain electrode 124 and the gate electrode 122.

Although FIG. 4 depicts a coplanar driving thin-film transistor, an inverted staggered driving thin-film transistor may also be used as the driving thin-film transistor T2. When an inverted staggered driving thin-film transistor is used, it may include the same structure as the driving thin-film transistor T2 shown in FIG. 4, except that the gate electrode 122 is disposed below the active layer 121.

A planarization layer 114 is disposed to cover the driving thin-film transistor T2. The planarization layer 114 reduces the level differences on the substrate 110 created by the driving thin-film transistor T2 and provides a flat surface over the substrate 110.

The organic light-emitting diode OLED is disposed on the planarization layer 114. The organic light-emitting diode OLED includes an anode 131, an organic layer 132, and a cathode 133.

The anode 131 is an electrode for supplying holes to the organic layer 132 and may be made of a transparent conductive material having a high work function. In addition, a reflective layer may be disposed under the anode 131. The reflective layer reflects light emitted from the organic layer 132 under the anode 131 and propagates it upward of the anode 131. The anode 131 may also be referred to as a pixel electrode.

The cathode 133 is an electrode for supplying electrons to the organic layer 132 and may be made of a metal having a relatively low work function. The cathode 133 may have a small thickness so as to sufficiently transmit the light emitted from the organic layer 132. In some aspects, the cathode 133 may be made of a transparent conductive oxide such as IZO. When the cathode 133 is made of a transparent conductive oxide, a metal material having a low work function may be doped into a portion of the organic layer 132 where the organic layer 132 and the cathode 133 are in contact with each other.

The organic layer 132 is disposed between the anode 131 and the cathode 133. The organic layer 132 includes an organic emitting layer. The organic layer 132 may be formed as a single, continuous piece so that it is shared by all of the sub-pixels on the substrate 110, as shown in FIG. 4. The organic emitting layer may be made of a material that emits white light, and a color filter may be disposed in line with the organic emitting layer. However, this is merely illustrative. In other implementations, the organic layer may be formed as a separate piece so that it is disposed in each of the sub-pixels. In such implementations, a red organic emitting layer may be disposed in a red sub-pixel, a green organic emitting layer may be disposed in a green sub-pixel, and a blue organic emitting layer may be disposed in a blue sub-pixel.

In addition to the organic emitting layer, the organic layer 132 may further include organic layers such as an injecting layer and a transporting layer for improving the luminous efficiency of the organic light-emitting diode OLED. For example, in addition to the organic emitting layer, a hole injecting layer or a hole transporting layer may be further disposed between the anode 131 and the cathode 133 so as to facilitate the movement of the holes. The hole injecting layer or the hole transporting layer may be formed as a single, continuous common layer so that it is shared by the plurality of sub-pixels.

A bank layer 115 may define a sub-pixel and expose a part of the upper surface of the anode 131. Specifically, the bank layer 115 may be disposed such that it covers the edge of the anode 131. The bank layer 115 is made of an insulative material for insulating the anodes 131 of adjacent sub-pixels from each other.

The organic light-emitting diode OLED emits light at a predetermined grayscale level in proportion to the amount of the driving current supplied through the driving thin-film transistor T2. The amount of the driving current is determined by Equation 1 below:

$$I_{OLED} = \frac{1}{2} \times \mu \times \frac{W}{L} \times C_{GI} \times (V_{GS} - V_{TH})^2 \quad \text{[Equation 1]}$$

where μ denotes the mobility of the charges, i.e., the carriers of the driving thin-film transistor T2, W/L denotes the ratio of the width W to the length L of the channel region CR overlapping the gate electrode 122 of the driving thin-film transistor T2, $C_{GI}$ denotes is a capacitance of the gate insulating layer 112 of the driving thin-film transistor T2, $V_{GS}$ denotes a potential difference between the gate electrode 122 and the source electrode 123 of the driving thin-film transistor T2, and $V_{TH}$ denotes the threshold voltage of the driving thin-film transistor T2.

As described above, the potential difference between the gate electrode 122 and the source electrode 123 of the driving thin-film transistor T2 during the turn-on period of the driving thin-film transistor T2 is held by the storage capacitor Cst. In addition, as described above with reference to FIG. 1, the storage capacitor Cst holds the voltage at the first node N1 equal to the data voltage Vdata for one frame. Therefore, the potential difference between the gate electrode 122 and the source electrode 123 of the driving thin-film transistor T2 is held equal to the data voltage Vdata during the turn-on period of the driving thin-film transistor T2. Thus, in Equation 1, $V_{GS}$ may correspond to the data voltage Vdata. That is, the driving current $I_{OLED}$ supplied to the organic light-emitting diode OLED can be adjusted by the data voltage Vdata.

As the performance of organic light-emitting diodes has been improved recently, the organic light-emitting diodes can emit light of a high luminance even with a low driving current $I_{OLED}$. As a result, the amount of the driving current required for an organic light-emitting diode to emit light at a high grayscale level also decreases. For example, if an organic light-emitting diode is driven to emit light at grayscale levels between 0 and 255, the difference between the amount of driving current required to emit light at the level of 255 and the amount of driving current required to emit light at the level of 0 decreases. As can be seen from Equation 1, the driving current $I_{OLED}$ is determined by the potential difference $V_{GS}$ between the gate electrode 122 and the source electrode 123 of the driving thin-film transistor T2, and the potential difference $V_{GS}$ between the gate electrode 122 and the source electrode 123 is equal to the data voltage Vdata. Thus, the difference between the data voltage Vdata required for displaying the level of 255 and the data voltage Vdata required for displaying the level of 0 decreases with the difference in the driving current $I_{OLED}$. As a result, the difference in the data voltage Vdata for displaying various grayscale levels become smaller.

Meanwhile, as can be seen from Equation 1, the driving current $I_{OLED}$ supplied to the organic light-emitting diode OLED may also be changed by the device characteristic of the driving thin-film transistor T2, for example, the threshold voltage $V_{TH}$ of the driving thin-film transistor T2. For an organic light-emitting device OLED that emits light even with a small driving current $I_{OLED}$, the difference between the driving current corresponding to the high luminance and the driving current corresponding to the low luminance is very small, such that the luminance is changed sensitively in response to change in the threshold voltage $V_{TH}$ of the driving thin-film transistor T2. For an active matrix organic light emitting display (AMOLED), each sub-pixel includes a driving thin-film transistor. If the driving thin-film transistors T2 of the sub-pixels have different threshold voltages $V_{TH}$, the sub-pixels may display different grayscale levels even though the same data voltage Vdata is applied. In addition, for a high-resolution organic light-emitting display device, a large number of sub-pixels are disposed in a small area, the driving thin-film transistors T2 have very small size. Accordingly, it is very difficult to make the threshold voltages $V_{TH}$ of the driving thin-film transistors T2 all equal. Therefore, when the threshold voltages $V_{TH}$ of the driving thin-film transistors T2 in the sub-pixels are different from one another, the sub-pixel display different grayscale levels in response to the same data voltage Vdata, such that there arises a problem that mura (i.e. irregularities such as stains or spots) can be seen in the organic light-emitting display device.

As described above, these problems become more serious as the performance of the organic light-emitting diode (OLED) is improved. That is, since the organic light-emitting diode OLED displays a high grayscale level even with a low driving current $I_{OLED}$, the difference in the driving current $I_{OLED}$ between the high grayscale level and the low grayscale level is minute, and accordingly the difference in the data voltage Vdata required for displaying various grayscale levels also decreases. As a result, the sub-pixels display different grayscale levels according to the deviations in the threshold voltage $V_{TH}$ of the driving thin film transistors T2.

In an organic light-emitting display device according to an exemplary aspect of the present disclosure, the amount of the driving current $I_{OLED}$ that changes according to change in the data voltage Vdata or the threshold voltage $V_{TH}$ is intentionally reduced, such that the grayscale of the organic light-emitting diode OLED is not greatly changed by a minute change in the driving current $I_{OLED}$.

Specifically, in an organic light-emitting display device according to an exemplary aspect of the present disclosure, the length of the first resistive region RR1 of the active layer 121 of the driving thin-film transistor T2 is increased, such that the amount of the driving current $I_{OLED}$ that is changed in response to change in the data voltage Vdata or the threshold voltage $V_{TH}$ is intentionally reduced. That is, the first resistive region RR1 increases the potential difference $V_{GS}$ between the gate electrode 122 and the source electrode 123, which is required for electrons to move from the source electrode 123 to the drain electrode 124 when the driving thin-film transistor T2 is turned on. As described above, since the first resistive region RR1 has a larger resistance than the source region SR, it can disturb the flow of electrons from the source region SR to the channel region CR. Accordingly, the potential difference $V_{GS}$ between the gate electrode 122 and the source electrode 123 of the driving thin-film transistor T2 which is required for generating the driving current $I_{OLED}$ of the same current amount may be increased. As a result, the data voltage Vdata required for driving the organic light-emitting diode OLED to emit light at a high grayscale level can be increased. For example, let us assume that the data voltage Vdata required for driving an organic light-emitting diode OLED to emit light at the grayscale level of 255 when the active layer 121 has a shorter first resistive region RR1 is 12 V. Then, the data voltage Vdata required for driving an organic light-emitting diode OLED to emit light at the grayscale level of 255 can be increased to 13 V if the active layer 121 has a long-length first resistive region RR1. In this case, the organic light-emitting diode OLED electrically connected to the driving thin-film transistor T2 having the short-length first resistance region RR1 is controlled with the data voltage Vdata from 0 V to 12 V to emit light of grayscale levels from 0 to 255. In contrast, the organic light-emitting diode OLED electrically connected to the driving thin-film transistor T2 having the long-length first resistance region RR1 is controlled with the data voltage Vdata from 0 V to 13 V to emit light of grayscale levels from 0 to 255.

As a result, the driving current $I_{OLED}$ output from the driving thin-film transistor T2 having the long-length first resistive region RR1 may not be greatly changed despite a minute change in the data voltage Vdata, and thus the grayscale of the organic light-emitting device OLED electrically connected to the driving thin-film transistor T2 may not greatly change. As a result, the gap between the levels of the data voltage Vdata required for emitting light of various grayscale levels can be widened, such that the grayscale of the organic light-emitting diode can be more easily controlled.

In particular, even if there is a change in the threshold voltage $V_{TH}$ of the driving thin-film transistor T2, as the potential difference $V_{GS}$ between the gate electrode 122 and the source electrode 123 is increased, the change of the term $(V_{GS}-V_{TH})^2$ in Equation 1 is more dependent on the voltage $V_{GS}$. As a result, the driving current $I_{OLED}$ supplied through the driving thin-film transistor T2 is not greatly affected by the change in the threshold voltage $V_{TH}$ of the driving thin-film transistor T2, such that the change in the grayscale of the organic light-emitting diode OLED can decrease.

Therefore, the grayscale of the organic light-emitting diode OLED does not change sensitively in response to a minute change in the data voltage Vdata or a minute change in the threshold voltage $V_{TH}$, such that mura (i.e. irregularities such as stains or spots) resulted from the change in the grayscale of the organic light-emitting diode OLED can be reduced.

Meanwhile, to increase the length of the first resistive region RR1, it may be contemplated to elongate the active layer 121. For a high-resolution organic light-emitting display device, however, there is limited space for disposing the driving thin-film transistors as described above. Therefore, it is not desired to increase the length of the active layer 121. The driving thin-film transistor T2 of an organic light-emitting display device according to an exemplary aspect of the present disclosure includes a channel region CR having a reduced length and a first resistive region RR1 having an increased length. The increased length of the first resistance region RR1 is equal to the reduced length of the channel region CR. That is, there is a trade-off between the length of the first resistive region RR1 and the length L of the channel region CR. Accordingly, the above-described effect can be achieved without substantially increasing the length of the active layer 121.

In addition, as described above, the length of the second resistive region RR2 is shorter than the length of the first resistive region RR1. In Equation 1, the driving current $I_{OLED}$ depends on the potential difference $V_{GS}$ between the gate electrode 122 and the source electrode 123 of the driving thin-film transistor T2, and thus the length of the second resistive region RR2 does not greatly affect the change in the driving current $I_{OLED}$. The second resistive region RR2 merely mitigates the intensity of the electric field propagating from the source region SR to the drain region DRIVE, to reduce the acceleration of electrons flowing from the source region SR to the drain region DR.

Figure 5:
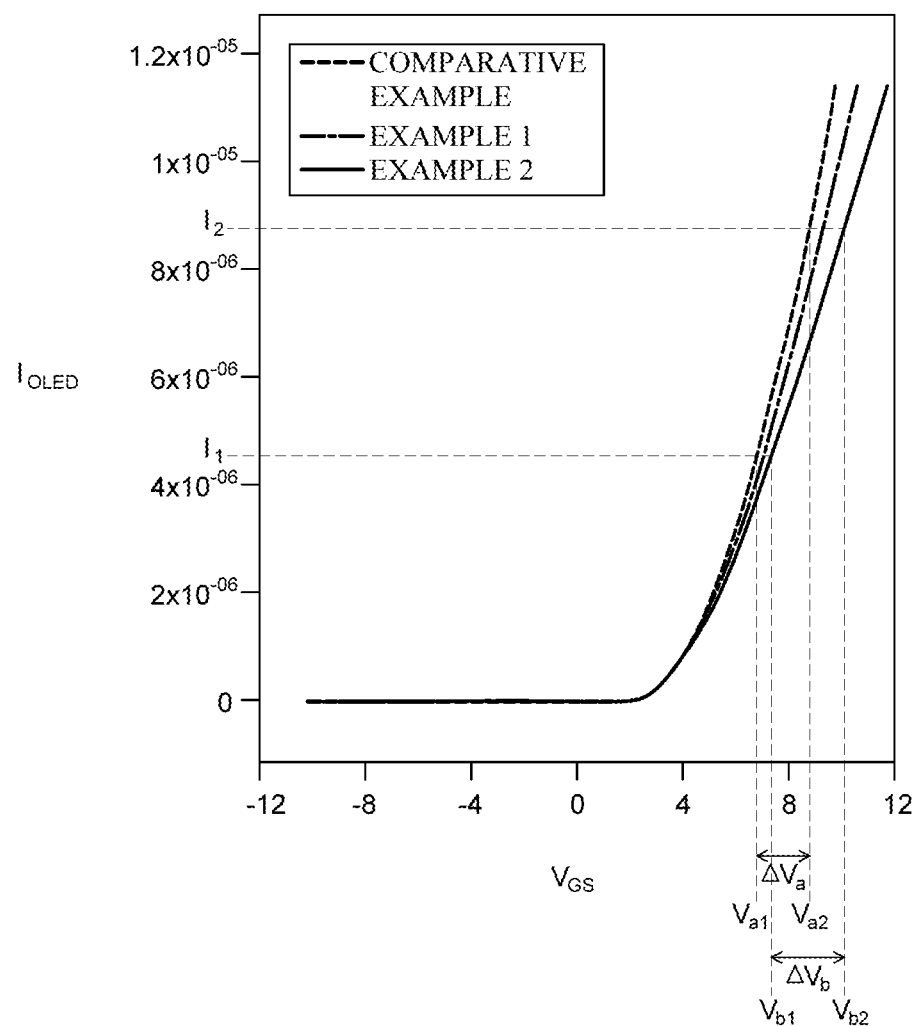
FIG. 5 is a graph showing changes in I-V characteristics of a driving thin film transistor of an organic light-emitting display device according to an exemplary aspect of the present disclosure.

The advantages achieved by the organic light-emitting display device according to the exemplary aspects of the present disclosure can be more clearly understood from the I-V curve of the driving thin-film transistor shown in FIG. 5.

FIG. 5 is a graph showing changes in I-V characteristics of a driving thin film transistor of an organic light-emitting display device according to an exemplary aspect of the present disclosure.

The I-V curves shown in FIG. 5 were measured using driving thin-film transistors T2 having the same structure, except that the channel region CR and the first resistance region RR1 have different lengths. Specifically, the driving thin-film transistors T2 according to Comparative Example and Examples 1 and 2 all include the active layer 121 having the width of 3.5 μm. In all of the driving thin-film transistors T2 according to Comparative Example and Examples 1 and 2, the sum of the lengths of the channel region CR and the first resistive region RR1 is equal to 21 μm. However, the driving thin-film transistors have different lengths of the channel region CR and different lengths of the first resistive region RR1. In addition, the driving thin-film transistors T2 according to Comparative Example and Examples 1 and 2 all include the second resistive region RR2 having the length of 1 μm.

Specifically, the driving thin-film transistor T2 according to Comparative Example includes the channel region CR having the length of 20 μm, and the first resistive region RR1 having the length of 1 μm. The driving thin-film transistor T2 according to Example 1 includes the channel region CR having the length of 19 μm, and the first resistive region RR1 having the length of 2 μm. The driving thin-film transistor T2 according to Example 2 includes the channel region CR having the length of 18 μm, and the first resistive region RR1 having the length of 3 μm. That is, in the driving thin-film transistors T2 according to Examples 1 and 2, the length of the first resistive region RR1 is equal to or larger than twice the length of the second resistance region RR2.

The I-V curves shown in FIG. 5 were obtained by measuring the driving current $I_{OLED}$ output through the source electrode 123 while varying the potential difference $V_{GS}$ between the gate electrode 122 and source electrode 123 from -10 V to 10 V, and maintaining the potential difference $V_{DS}$ between the drain electrode 124 and the source electrode 123 to 10 V.

Referring to FIG. 5, it can be seen that the slopes of the I-V curves decrease as the length of the first resistive region RR1 increases. That is, when Example 2 is compared to Comparative Example, the potential difference $V_{GS}$ between the gate electrode 122 and the source electrode 123 required for generating the driving current $I_{OLED}$ of I1 is increased from Va1 to Vb1, and the potential difference $V_{GS}$ between the gate electrode 122 and the source electrode 123 required for generating the driving current $I_{OLED}$ of I2 is increased from Va2 to Vb2. In addition, change in the potential difference $V_{GS}$ between the gate electrode 122 and the source electrode 123 required for changing the driving current $I_{OLED}$ from I1 to I2 is larger in Example 2 than in Comparative Example That is, in Comparative Example, the change in the potential difference $V_{GS}$ between the gate electrode 122 and the source electrode 123 required for changing from I1 to I2 is ΔVa, whereas in Example 2, the change in the potential difference $V_{GS}$ between the gate electrode 122 and the source electrode 123 required for changing from I1 to I2 is ΔVb. It can be seen that ΔVa<ΔVb, and thus the change in the driving current $I_{OLED}$ due to the change in the potential difference $V_{GS}$ between the gate electrode 122 and the source electrode 123 of the drive thin-film transistor T2 is smaller in Example 2 than in Comparative Example.

Consequently, as the length of the first resistive region RR1 increases, the change in the driving current $I_{OLED}$ output through the driving thin-film transistor T2 decreases relative to the change in the potential difference $V_{GS}$ between the gate electrode 122 and the source electrode 123. That is, in order to change the grayscale level of the organic light-emitting diode OLED, the potential difference $V_{GS}$ between the gate electrode 122 and the source electrode 123 has to be changed more, and thus the gap between the levels of the potential difference $V_{GS}$ between the gate electrode 122 and the source electrodes 123 corresponding to the change between the grayscale levels is widened. Therefore, the organic light-emitting diode OLED of the organic light-emitting display device according to an exemplary aspect of the present disclosure does not react sensitively to the change in the data voltage Vdata. Accordingly, the grayscale of the organic light-emitting diode OLED can be easily controlled.

FIGS. 6A to 6D are schematic cross-sectional views for illustrating a method of fabricating a driving thin-film transistor of an organic light-emitting display device according to an exemplary aspect of the present disclosure. The driving thin-film transistor fabricated by the method shown in FIGS. 6A to 6D is identical to the driving thin-film transistor T2 included in the organic light-emitting display device shown in FIGS. 1 to 4. Therefore, the method shown in FIGS. 6A to 6D will be described in conjunction with FIGS. 1 to 4.

Figure 6A:
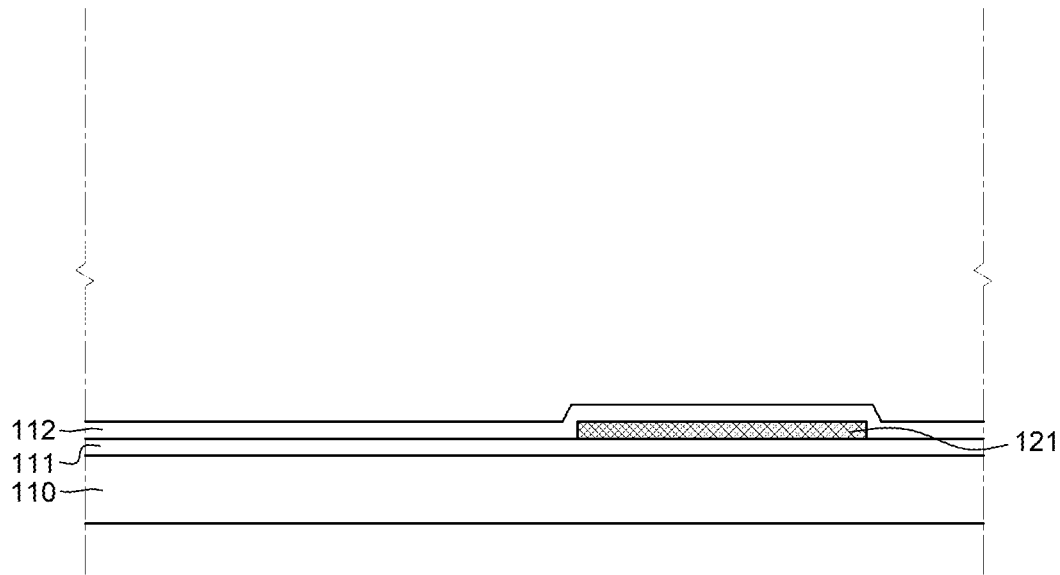
FIGS. 6A to 6D are schematic cross-sectional views for illustrating a method of fabricating a driving thin-film transistor of an organic light-emitting display device according to an exemplary aspect of the present disclosure.

Referring to FIG. 6A, a buffer layer 111 is formed on the substrate 110. The buffer layer 111 may be made of silicon oxide (SiOx) and/or silicon nitride (SiN$_x$), and may be formed on the substrate 110 by chemical vapor deposition (CVD), plasma enhanced vapor deposition (PECVD), etc.

An active layer 121 is formed on the buffer layer 111. The active layer 121 may be formed by depositing amorphous silicon on the buffer layer 111, crystallizing the amorphous silicon by a laser annealing process, and patterning the crystallized polysilicon.

Subsequently, a gate insulating layer 112 is formed on the active layer 121. The gate insulating layer 112 is formed by depositing silicon oxide and/or silicon nitride by CVD, PECVD, etc. The gate insulating layer 112 has a small thickness. For example, the gate insulating layer 112 may have the thickness of 1,000 Å.

A gate electrode 122 is formed on the gate insulating layer 112. The gate electrode 122 is formed by forming a metal layer with a metal such as molybdenum (Mo), titanium (Ti), copper (Cu), aluminum (Al) and chrome (Cr) and then patterning it. The gate electrode 122 overlaps the channel region CR of the active layer 121.

Figure 6B:
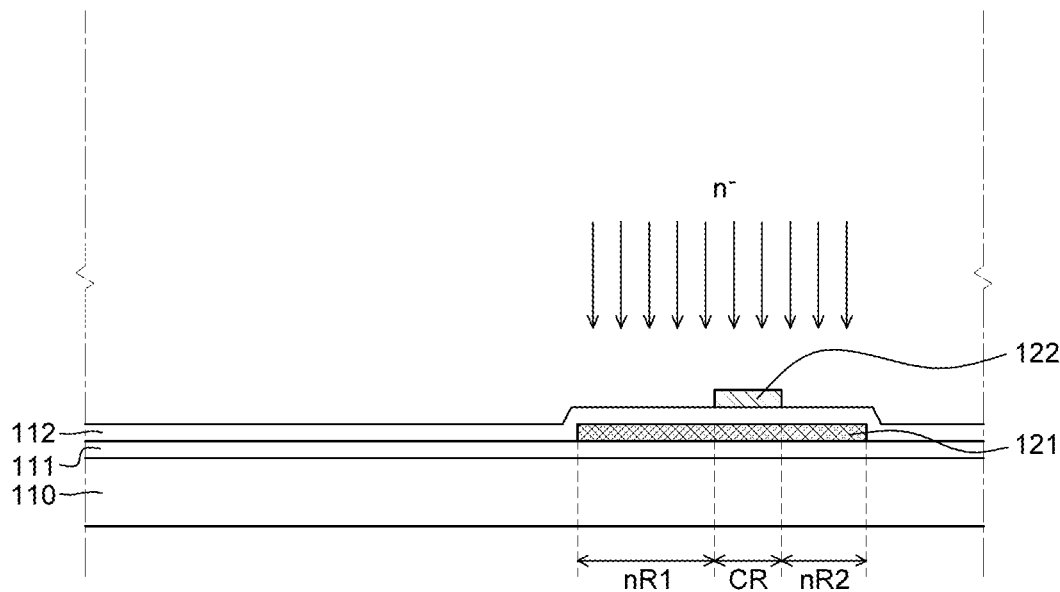

Referring to FIG. 6B, n-type impurities are doped using the gate electrode 122 as a mask. For example, phosphorus (P) may be doped through an ion implantation process. Since the gate insulating layer 112 has a small thickness of approximately 1,000 Å, the n-type impurities pass through the thin gate insulating layer 122 to be doped into the active layer 121. The n-type impurities are doped in a first doped region nR1 and a second doped region nR2 except for the channel region CR below the gate electrode 122. The n-type impurities are doped at a relatively low concentration. For example, the first doped region nR1 and the second doped region nR2 may be doped at such a low concentration that they are LDD regions. For convenience of illustration, this is defined as n− doping. Therefore, the first doped region nR1 and the second doped region nR2 have a high resistance.

Subsequently, laser or heat of 400 to 600° C. is applied to the doped regions to activate them. Although some of the doped impurities may permeate into the channel region CR during the activation process, the majority of the impurities exist in the first doped region nR1 and the second doped region nR2. Therefore, the boundary between the first doped region nR1 and the channel region CR may be defined as the boundary between the region where the n-type impurities exist and the region where no n-type impurity exists.

Figure 6C:
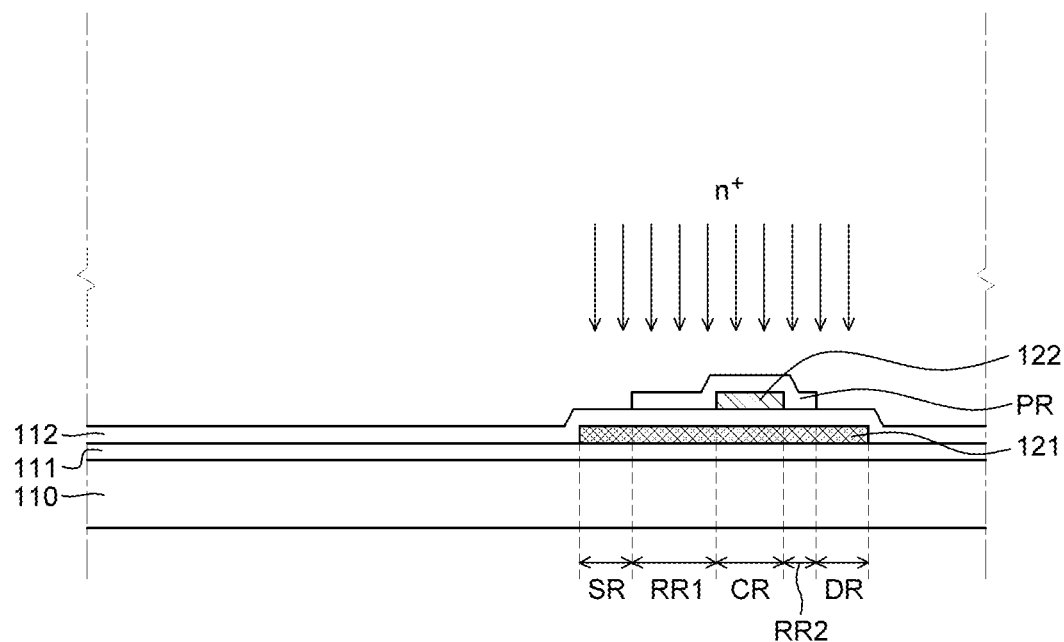

Referring to FIG. 6C, a photoresist is applied to cover the gate electrode 122, and a shadow mask covering the first resistive region RR1, the channel region CR, and the second resistive region RR2 is used to expose the photoresist to light. Then, the photoresist is developed to form a photoresist mask PR covering the first resistive region RR1, the channel region CR and the second resistive region RR2.

Subsequently, the active layer 121 is doped with the n-type impurities at a high concentration. For convenience of illustration, this is defined as n+ doping. The n+ doping may be performed so that the concentration of the n-type impurities is equal to 5 to 10 times that of n− doping. In this case, the first resistive region RR1, the channel region CR and the second resistive region RR2 covered with the photoresist mask PR are not doped with the n-type impurities, while the source region SR and the drain region DR are doped with n-type impurities. The source region SR and the drain region DR contain n-type impurities doped at a low concentration in the n− doping process, and the concentration of n-type impurities can be increased by the n+ doping.

Subsequently, the source region SR and the drain region DR are irradiated with laser or heated to activate the source region SR and the drain region DR. Thus, the source region SR and the drain region DR have excellent conductivity and have electric characteristics similar to those of a conductor.

The source region SR and the drain region DR contain the n-type impurities at the concentration equal to five times that of the first resistive region RR1 and the second resistive region RR2. Accordingly, the boundary between the source region SR and the first resistive region RR1 may be defined as a portion where the concentration of the n-type impurities starts to abruptly increase from the first resistive region RR1. In addition, the boundary between the drain region DR and the second resistive region RR2 may be defined as a portion where the concentration of the n-type impurities starts to abruptly increase from the second resistive region RR2.

Figure 6D:
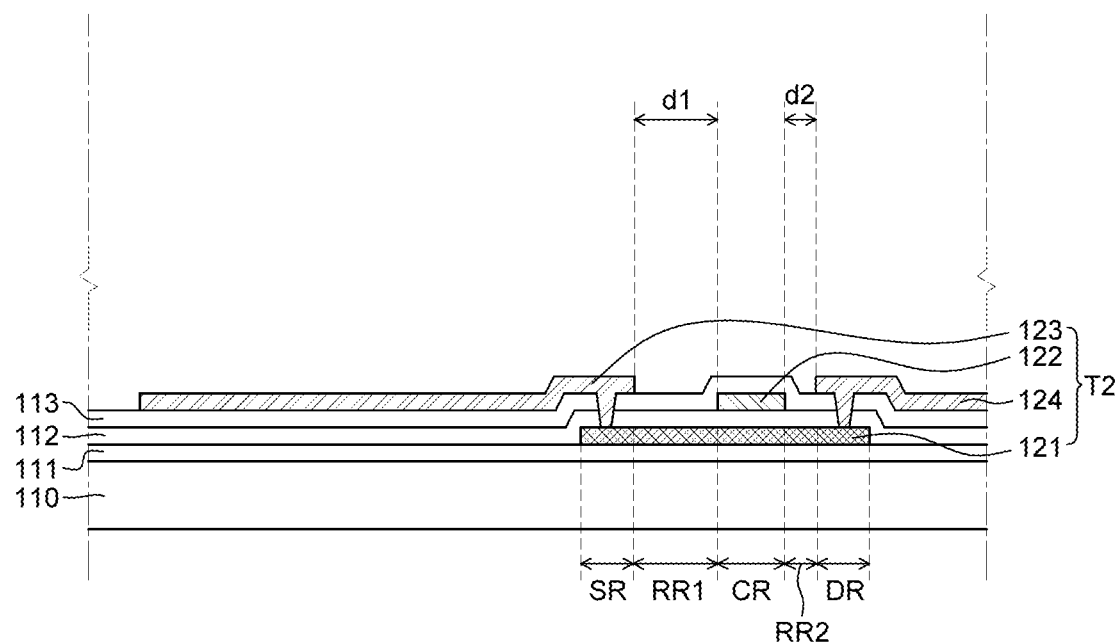

Referring to FIG. 6D, the photoresist mask PR is removed, and an interlayer insulating layer 113 is formed so as to cover the gate electrode 122. For example, the interlayer insulating layer 113 is formed by depositing silicon oxide and/or silicon nitride by a process such as CVD and PECVD.

After the interlayer insulating layer 113 is formed, contact holes are formed in the interlayer insulating layer 113 and the gate insulating layer 112 by a photolithography process. The contact holes may be formed in line with the source region SR and the drain region DR, respectively. The source region SR and the drain region DR of the active layer 121 are exposed through the contact holes, respectively.

After a metal layer is formed to cover the interlayer insulating layer 113, the metal layer is pattern, such that the source electrode 123 and the drain electrode 124 are formed. The metal layer may be formed by depositing a metal such as molybdenum, titanium, copper, aluminum and chromium by sputtering, for example.

As described above, in the driving thin-film transistor T2 of the organic light-emitting display device according to an exemplary aspect of the present disclosure, the active layer 121 may be formed by performing the n− doping and the n+ doping. Since the active layer 121 includes the first resistive region RR1 longer than the second resistive region RR2, the potential difference $V_{GS}$ between the gate electrode 122 and the source electrode 123 may increase, which is necessary for changing the grayscale of the organic light-emitting diode OLED. Accordingly, the grayscale of the organic light-emitting diode OLED may not be sensitively changed by a minute change in the data voltage Vdata equal to the potential difference $V_{GS}$ between the gate electrode 122 and the source electrode 123, and thus the driving thin-film transistor T2 can more easily control the grayscale of the grayscale of the organic light-emitting diode OLED.

Figure 7:
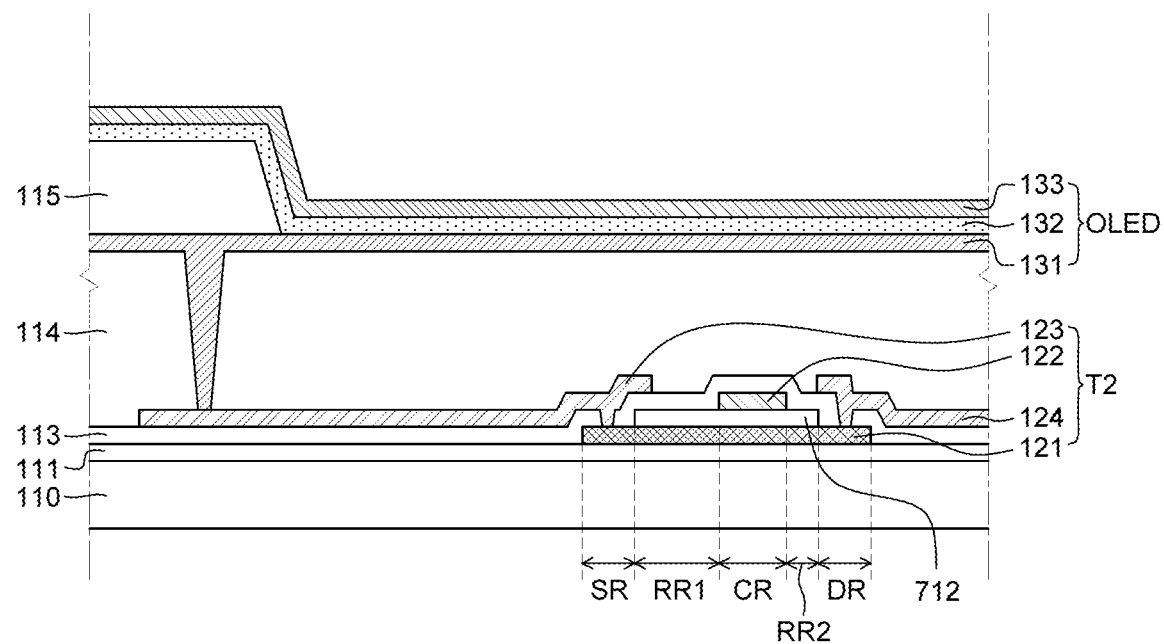
FIG. 7 is a schematic cross-sectional view for illustrating a driving thin-film transistor of an organic light-emitting display device according to another exemplary aspect of the present disclosure.

FIG. 7 is a schematic cross-sectional view for illustrating a driving thin-film transistor of an organic light-emitting display device according to another exemplary aspect of the present disclosure. The driving thin-film transistor T2 of the organic light-emitting display device shown in FIG. 7 is substantially identical to the driving thin-film transistor T2 shown in FIG. 4 except for that the former further includes a gate insulating layer 712 disposed on the first resistive region RR1, the channel region CR and the second resistive region RR2; and, therefore, the redundant description will be omitted.

Referring to FIG. 7, the gate insulating layer 712 does not cover the entire surface of the active layer 121 but disposed on the first resistive region RR1, the channel region CR and the second resistive region RR2 of the active layer 121. Since the gate electrode 122 is in line with the channel region CR, the width the gate insulating layer 712 is equal to the sum of the lengths of the first resistive region RR1, the channel region CR and the second resistive region RR2. Accordingly, the width of the gate insulating layer 712 is greater (i.e. longer) than the width of the gate electrode 122, which is equal to the length of the channel region CR.

In the driving thin-film transistor T2 of the organic light-emitting display device according to this exemplary aspect of the present disclosure, the gate insulating layer 712 is disposed on the first resistive region RR1, the channel region CR and the second resistive region RR2, such that there is an advantage in that the gate insulating layer 712 can be used as a mask during the process of doping the active layer 121 with the n-type impurities. Detailed description thereon will be given below with reference to FIGS. 8A to 8D.

FIGS. 8A to 8D are schematic cross-sectional views for illustrating a method of fabricating a driving thin-film transistor of an organic light-emitting display device according to another exemplary aspect of the present disclosure.

Figure 8A:
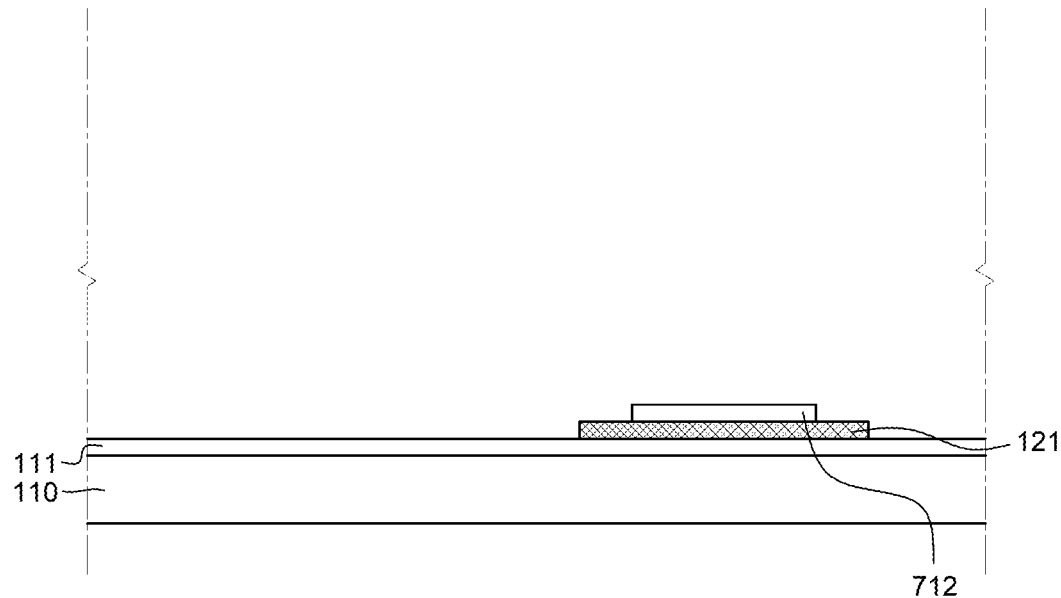
FIGS. 8A to 8D are schematic cross-sectional views for illustrating a method of fabricating a driving thin-film transistor of an organic light-emitting display device according to another exemplary aspect of the present disclosure.

Referring to FIG. 8A, a gate insulating layer 712 is formed on an active layer 121. The gate insulating layer 712 may be formed by depositing silicon oxide and/or silicon nitride by CVD, PECVD, etc., and then patterning it. In doing so, by using a shadow mask covering the first resistive region RR1, the channel region CR and the second resistive region RR2 of the active layer 121, an insulating layer made of silicon oxide and/or silicon nitride are patterned, such that the gate insulating layer 712 may be formed.

Figure 8B:
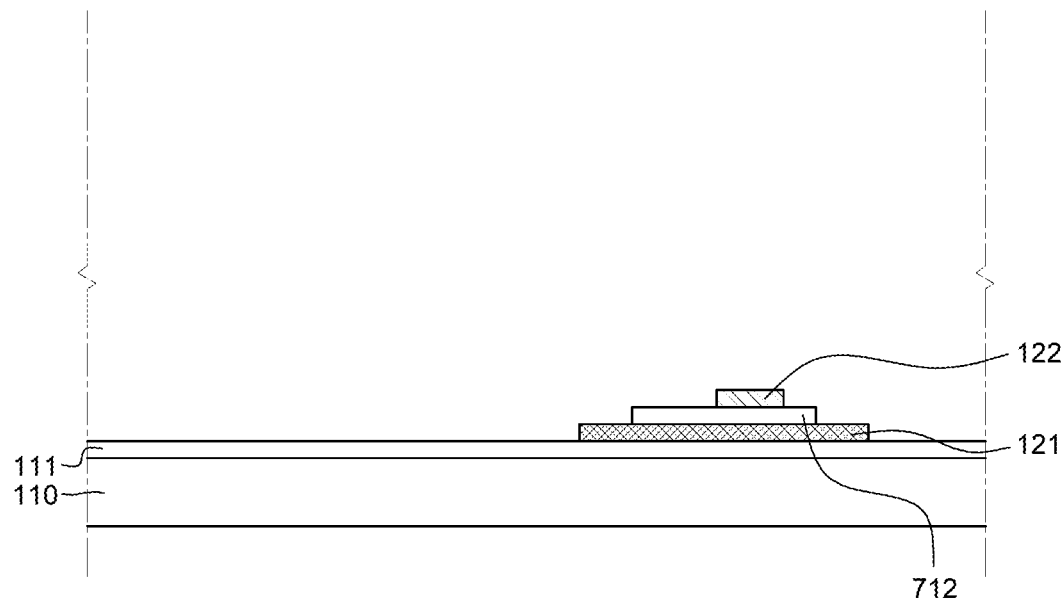

Referring to FIG. 8B, a gate electrode 122 is formed on the gate insulating layer 712. The gate electrode 122 may be formed by forming a metal layer to cover the gate insulating layer 712 and the active layer 121, and then patterning the metal layer.

Figure 8C:
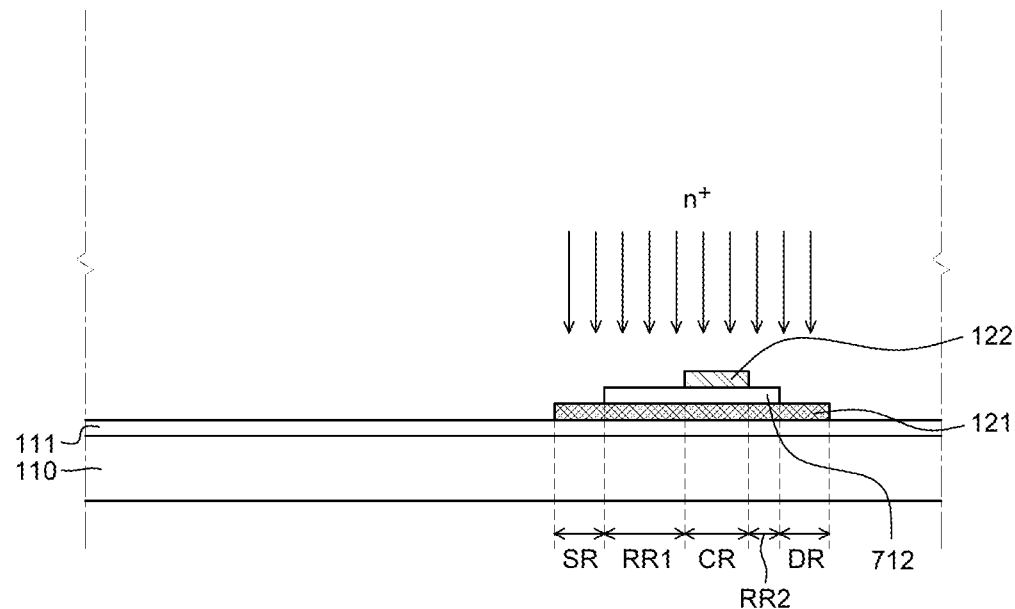

Referring to FIG. 8C, the n+ doping is performed on the gate insulating layer 712 as a target. In doing so, the gate insulating layer 712 and the gate electrode 122 can be used as masks for the n+ doping. Specifically, since two layers of the gate insulating layer 712 and the gate electrode 122 are disposed above the channel region CR, the n-type impurities may not be doped during the n+ doping. On the other hand, since the gate insulating layer 712 is disposed on the first resistive region RR1 and the second resistive region RR2, only some of the n-type impurities may be doped during the n+ doping. That is, some of the n-type impurities may not be implanted by the gate insulating layer 712 during the ion implantation process, and only n-type impurities at a low concentration may pass through the gate insulating layer 712, to be doped into the first resistive region RR1 and the second resistive region RR2. On the other hand, since neither of the gate insulating layer 712 and the gate electrode 122 is disposed on the source region SR and the drain region DR, most of the n-type impurities may be implanted thereto. As a result, the source region SR and the drain region DR are doped with the n-type impurities at a high concentration.

Subsequently, the active layer 121 is irradiated with a laser or heated, such that the source region SR, the first resistive region RR1, the second resistive region RR2 and the drain region DR are activated. Since the source region SR and the drain region DR contain the n-type impurities at a high concentration, the regions having high conductivity. In contrast, since the first resistive region RR1 and the second resistive region RR2 contain the n-type impurities at a low concentration, the regions have a low conductivity and a high resistance.

Figure 8D:
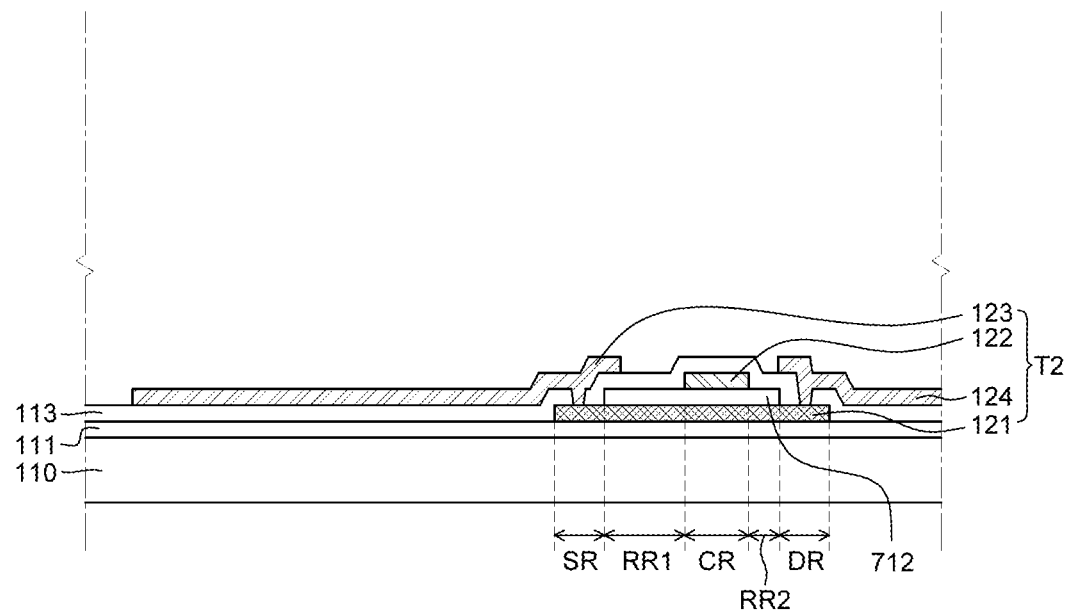

Referring to FIG. 8D, an interlayer insulating layer 113 is formed to cover the gate electrode 122 and the active layer 121, and contact holes exposing the source region SR and the drain region DR, respectively, are formed in the interlayer insulating layer 113. Subsequently, a source electrode 123 connected to the source region SR and a drain electrode 124 connected to the drain region DR are formed.

In the driving thin-film transistor T2 of the organic light-emitting display device according to this exemplary aspect of the present disclosure, the active layer 121 may be formed by performing the n+ doping once. Thus, the process of fabricating the thin-film transistor T2 can be simplified, and the cost of producing the organic light-emitting display device can be saved. In addition, the driving thin-film transistor T2 of the organic light-emitting display device according to this exemplary aspect of the present disclosure includes the first resistive region RR1 longer than the second resistive region RR2. Accordingly, the driving current outputted through the driving thin-film transistor T2 may not sensitively change in response to a minute change in the potential difference between the gate electrode 122 and the source electrode 123 of the driving thin-film transistor T2. As a result, the grayscale of the organic light-emitting diode electrically connected to the driving thin-film transistor T2 may not greatly change in response to a change in the potential difference between the gate electrode 122 and the source electrode 123, such that the driving thin-film transistor T2 can control the grayscale of the organic light-emitting diode more easily.

The exemplary aspects of the present disclosure can also be described as follows:

According to an aspect of the present disclosure, a thin-film transistor includes an active layer, a gate electrode, a source electrode and a drain electrode. The gate electrode overlaps the active layer. The source electrode and the drain electrode are connected to the active layer. The active layer includes a source region connected to the source electrode, a drain region connected to the drain electrode, a channel region overlapping with the gate electrode, a first resistive region between the source region and the channel region, and a second resistive region between the drain region and the channel region. The length of the first resistive region is larger than the length of the second resistive region on the plane. A thin film transistor according to an exemplary aspect of the present disclosure intentionally increases the resistance between the source region and the channel region using the first resistive region of the active layer. Accordingly, the potential difference between the gate electrode and the source electrode necessary for moving the charges from the source region to the drain region when the thin film transistor is turned on may be increased. As a result, the change in the driving current in response to the change in the potential difference between the gate electrode and the source electrode is reduced, such that the gap between the levels of the potential difference between the gate electrode and the source electrode for changing the driving current can be widened.

The length of the first resistive region is a length of the shortest line extending from a boundary between the channel region and the first resistance region to a boundary between the source region and the first resistance region, and the length of the second resistive region is a length of the shortest line extending from a boundary between the channel region and the second resistive region to a boundary between the drain region and the second resistive region.

The area of the first resistive region may be larger than the area of the second resistive region.

The resistance of the first resistive region may be equal to or larger than twice the resistance of the second resistive region.

The thin film transistor may further include a gate insulating layer on the active layer. The gate insulating layer may be disposed on the channel region, the first resistive region, and the second resistive region. The gate electrode may be in line with the channel region.

The shortest distance from the side line of the gate electrode to the side line of the source electrode may be larger than the shortest distance from the side line of the gate electrode to the side line of the drain electrode.

The active layer may be made of polysilicon, and the amount of impurities doped into the first resistive region and the second resistive region may be smaller than that of the source region and the drain region.

The first resistive region, the second resistive region, and the channel region may be undoped regions.

The active layer may be made of metal oxide, each of the source region and the drain region may be a conductive region, and the resistance of the first resistance region and the second resistance region may be higher than that of the source region and the drain region.

According to an aspect of the present disclosure, an organic light-emitting display device includes an organic light-emitting diode and a thin-film transistor. The thin-film transistor is electrically connected to the organic light-emitting diode and has an active layer, a gate electrode overlapping with the active layer, and a source electrode and a drain electrode connected to the active layer. The active layer includes a first resistive region that increases a potential difference ($V_{GS}$) between the gate electrode and the source electrode necessary for moving charges from the source electrode to the drain electrode when the thin-film transistor is turned on. The organic light-emitting display device according to an exemplary aspect of the present disclosure includes a thin-film transistor having a first resistive region. The first resistive region increases the potential difference between the gate electrode and the source electrode required for moving the charges from the source electrode to the drain electrode when the thin film transistor is turned on. Accordingly, the driving current output through the thin-film transistor may not be greatly changed despite a change in the potential difference between the gate electrode and the source electrode. Accordingly, the grayscale of the organic light-emitting diode may not be sensitive to a change in the potential difference between the gate electrode and the source electrode, such that the grayscale of the organic light-emitting diode can be controlled more easily.

The active layer may further include a source region connected to the source electrode, a drain region connected to the drain electrode, a channel region overlapping with the gate electrode, and a second resistive region between the channel region and the drain region. The length of the first resistive region, i.e., the shortest line extending from a boundary between the channel region and the first resistance region to a boundary between the source region and the first resistance region, may be larger than the length of the second resistive region, i.e., the shortest line extending from a boundary between the channel region and the second resistive region to a boundary between the drain region and the second resistive region.

The organic light-emitting diode may include: an anode electrically connected to the source electrode or the drain electrode; an organic layer on the anode; and a cathode on the organic layer.

Thus far, exemplary aspects of the present disclosure have been described in detail with reference to the accompanying drawings. However, the present disclosure is not limited to the exemplary aspects, and modifications and variations can be made thereto without departing from the technical idea of the present disclosure. Accordingly, the exemplary aspects described herein are merely illustrative and are not intended to limit the scope of the present disclosure. The technical idea of the present disclosure is not limited by the exemplary aspects. Therefore, it should be understood that the above-described aspects are not limiting but illustrative in all aspects. The scope of protection sought by the present disclosure is defined by the appended claims and all equivalents thereof are construed to be within the true scope of the present disclosure.

What is claimed is:

1. A thin-film transistor comprising:
    an active layer;
    a gate electrode overlapping the active layer; and
    a source electrode and a drain electrode connected to the active layer, the active layer comprising:
    a source region connected to the source electrode;
    a drain region connected to the drain electrode;
    a channel region overlapping the gate electrode;
    a first resistive region between the source region and the channel region; and
    a second resistive region between the drain region and the channel region, and a length of the first resistive region is greater than a length of the second resistive region,
    wherein the source electrode includes a lateral end portion that is vertically aligned with a boundary between the source region and the first resistivity region, and the drain electrode includes a lateral end portion that is vertically aligned with a boundary between the drain region and the second resistivity region.

2. The thin-film transistor of claim 1, wherein the length of the first resistive region equals a shortest distance from a boundary between the channel region and the first resistive region to a boundary between the source region and the first resistive region, and
    wherein the length of the second resistive region equals a shortest distance from a boundary between the channel region and the second resistive region to a boundary between the drain region and the second resistive region.

3. The thin-film transistor of claim 1, wherein the first resistive region has an area larger than that of the second resistive region.

4. The thin-film transistor of claim 1, further comprising:
    a gate insulating layer on the active layer,
    wherein the gate insulating layer corresponds to the channel region, the first resistive region and the second resistive region, and the gate electrode corresponds to the channel region.

5. The thin-film transistor of claim 4, wherein a shortest lateral distance between the gate electrode and the source electrode is greater than a shortest lateral distance between the gate electrode and the drain electrode.

6. The thin-film transistor of claim 1, wherein the active layer is made of polysilicon, and each amount of impurities doped in the first resistive region and the second resistive region is smaller than each amount of impurities doped in the source region and the drain region.

7. An organic light-emitting display device comprising:
    a switching thin-film transistor having an active layer in a sub-pixel region,
    wherein the active layer of the switching thin-film transistor includes a first resistive region of the switching thin-film transistor between a source region of the switching thin-film transistor and a channel region of the switching thin-film transistor and a second resistive region of the switching thin-film transistor between the channel region of the switching thin-film transistor and a drain region of the switching thin-film transistor, and
    an organic light-emitting diode in the sub-pixel region; and
    a driving thin-film transistor electrically connected to the organic light-emitting diode and comprising an active layer of the driving thin-film transistor, a gate electrode of the driving thin-film transistor overlapping the active layer of the driving thin-film transistor, and a source electrode of the driving thin-film transistor and a drain electrode of the driving thin-film transistor connected to the active layer,
    wherein the active layer of the driving thin-film transistor includes a first resistive region of the driving thin-film transistor between a source region of the driving thin-film transistor and a channel region of the driving thin-film transistor that increases a potential difference ($V_{Gs}$) between the gate electrode of the driving thin-film transistor and the source electrode of the driving thin-film transistor, to move charges from the source electrode of the driving thin-film transistor to the drain electrode of the driving thin-film transistor when the driving thin-film transistor is turned on, and a second resistive region of the driving thin-film transistor between the channel region of the driving thin-film transistor and a drain region of the driving thin-film transistor, and wherein a length of the first resistive region of the switching thin-film transistor is same as a length of the second resistive region of the switching thin-film transistor and a length of the first resistive region of the driving thin-film transistor is different from a length of the second resistive region of the driving thin-film transistor.

8. The device of claim 7, wherein the source region of the driving thin-film transistor is connected to the source electrode of the driving thin-film transistor, the drain region of the driving thin-film transistor is connected to the drain electrode of the driving thin-film transistor, the channel region of the driving thin-film transistor is overlapping the gate electrode of the driving thin-film transistor, and wherein the length of the first resistive region of the driving thin-film transistor is greater than the length of the second resistive region of the driving thin-film transistor, the length of the first resistive region of the driving thin-film transistor being equal to a shortest distance from a boundary between the channel region of the driving thin-film transistor and the first resistive region of the driving thin-film transistor on the active layer of the driving thin-film transistor to a boundary between the first resistive region of the driving thin-film transistor and the source region of the driving thin-film transistor, and the length of the second resistive region of the driving thin-film transistor being equal to a shortest distance from a boundary between the channel region of the driving thin-film transistor and the second resistive region of the driving thin-film transistor on the active layer of the driving thin-film transistor to a boundary between the drain region of the driving thin-film transistor and the second resistive region of the driving thin-film transistor.

9. The device of claim 7, wherein the organic light-emitting diode comprises:
an anode electrically connected to the source electrode of the driving thin-film transistor or the drain electrode of the driving thin-film transistor;
an organic light emitting layer on the anode; and
a cathode on the organic light emitting layer.

10. A thin-film transistor for a display device, comprising:
an active layer comprising a source region, a drain region, and a channel region, and first and second resistive regions;
a gate electrode vertically overlapping the active layer; and
source and drain electrodes, both connected to the active layer,
wherein the first resistive region has a first length and disposed between the source region and the channel region and the second resistive region has a second length and disposed between the drain region and the channel region, and the first length is greater than the second length,
wherein the source electrode includes a lateral end portion that is vertically aligned with a boundary between the source region and the first resistivity region, and the drain electrode includes a lateral end portion that is vertically aligned with a boundary between the drain region and the second resistivity region, and
wherein the first length configured to minimize a variation in a potential difference between the gate electrode and the source electrode with respect to a variation in a driving current of the display device.

11. The thin-film transistor of claim 10, wherein the first length equals a shortest distance from a boundary between the channel region and the first resistive region to a boundary between the source region and the first resistive region, and
wherein the second length equals a shortest distance from a boundary between the channel region and the second resistive region to a boundary between the drain region and the second resistive region.

12. The thin-film transistor of claim 10, wherein the first resistive region has an area larger than that of the second resistive region.

13. The thin-film transistor of claim 10, wherein the first resistive region has a resistance at least twice a resistance of the second resistive region.

14. The thin-film transistor of claim 10, further comprising:
a gate insulating layer on the active layer,
wherein the gate insulating layer corresponds to the channel region, the first resistive region and the second resistive region, and the gate electrode corresponds to the channel region.

15. The thin-film transistor of claim 10, wherein a shortest lateral distance between the gate electrode and the source electrode is greater than a shortest lateral distance between the gate electrode and the drain electrode.

16. The thin-film transistor of claim 10, wherein the active layer is made of polysilicon, and each amount of impurities doped in the first resistive region and the second resistive region is smaller than each amount of impurities doped in the source region and the drain region.

17. An organic light-emitting display device comprising:
an organic light-emitting diode;
a driving thin-film transistor, electrically connected to the organic light-emitting diode, configured to adjust an amount of a driving current supplied to the organic light-emitting diode, including:
an active layer;
a gate electrode overlapped with the active layer;
a source electrode electrically connected to the active layer; and
a drain electrode electrically connected to the active layer,
a switching thin-film transistor, electrically connected to the driving thin-film transistor; and
a storage capacitor electrically connected to a first node between the driving thin-film transistor and the switching thin-film transistor and to a second node between the driving thin-film transistor and the organic light-emitting diode,
wherein the active layer includes a first resistive region between the source electrode and the gate electrode and a second resistive region between the gate electrode and the drain electrode,
wherein a length of the second resistive region is shorter than a length of the first resistive region, and
wherein a potential difference (VGS) between the gate electrode and the source electrode is increased by the length of the first resistive region.

18. The organic light-emitting display device of claim 17, wherein a source electrode of the switching thin-film transistor and a drain electrode of the switching thin-film transistor are symmetrical with respect to a gate electrode of the switching thin-film transistor.

19. The organic light-emitting display device of claim 17, further comprising a first resistive region of the switching thin-film transistor and a second resistive region of the switching thin-film transistor having the same length, respectively.

20. The organic light-emitting display device of claim 17, further comprising a plurality of sub-pixels,
   wherein each sub-pixel includes the driving thin-film transistor, and
   wherein a change in the driving current in response to a change in the potential difference (VGS) between the gate electrode and the source electrode is reduced by the length of the first resistive region.

21. The organic light-emitting display device of claim 17, further comprising an anode electrically connected to the source electrode of the driving thin-film transistor, an organic light emitting layer on the anode, and a cathode on the organic light emitting layer.

22. The organic light-emitting display device of claim 17, wherein a shortest lateral distance between the gate electrode of the driving thin-film transistor and the source electrode of the driving thin-film transistor is greater than a shortest lateral distance between the gate electrode of the driving thin-film transistor and the drain electrode of the driving thin-film transistor.

23. The organic light-emitting display device of claim 17, wherein the first resistive region has an area larger than the second resistive region.

24. The organic light-emitting display device of claim 17, wherein the active layer is made of polysilicon, and each amount of impurities doped in the first resistive region and the second resistive region is smaller than each amount of impurities doped in the source region and the drain region.

* * * * *